United States Patent
Corteville et al.

(10) Patent No.: US 6,832,345 B2
(45) Date of Patent: Dec. 14, 2004

(54) METHOD FOR COEXISTENCE AND COOPERATION BETWEEN SYSTEM FIRMWARE AND DEBUG CODE

(75) Inventors: Robert V. Corteville, Rochester, MN (US); Daniel Morgan Crowell, Rochester, MN (US); James Fred Daily, Chatfield, MN (US); Christopher John Engel, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 590 days.

(21) Appl. No.: 09/873,850

(22) Filed: Jun. 4, 2001

(65) Prior Publication Data

US 2002/0184565 A1 Dec. 5, 2002

(51) Int. Cl.[7] ................................................ G06F 11/00
(52) U.S. Cl. .............................. 714/48; 714/25; 714/30
(58) Field of Search .............................. 714/25, 30, 36, 714/37, 48

(56) References Cited

U.S. PATENT DOCUMENTS

| | | | | |
|---|---|---|---|---|
| 5,937,154 A | * | 8/1999 | Tegethoff | 714/30 |
| 6,272,454 B1 | * | 8/2001 | Morita et al. | 703/28 |
| 6,336,195 B1 | * | 1/2002 | Shen et al. | 714/34 |
| 6,647,511 B1 | * | 11/2003 | Swoboda et al. | 714/30 |
| 2001/0034865 A1 | * | 10/2001 | Park et al. | 714/724 |
| 2003/0237062 A1 | * | 12/2003 | Whitehill | 716/4 |

* cited by examiner

Primary Examiner—Robert Beausoliel
Assistant Examiner—Emerson Puente
(74) Attorney, Agent, or Firm—Joan Pennington

(57) ABSTRACT

A method and apparatus are provided for implementing coexistence and cooperation between system firmware and debug code. A service processor is coupled to a machine under test for sending system firmware test functions to the machine under test and receiving test data from the machine under test. A host computer is coupled to the service processor for sending bring-up tool debug test functions to the machine under test and receiving test data from the machine under test. The system firmware starts without user intervention on initial power-on routine of the machine under test. When the host computer receives a user request, the host computer notifies the service processor. The bring-up tool debug test functions are started responsive to the user request. The system firmware can be used for certain operations to a certain point in an operational test sequence of the machine under test and then the debug tool debug test functions are used for other functions that are not implemented in the system firmware. A user can use either the system firmware or the bring-up tool debug test functions at any time.

17 Claims, 2 Drawing Sheets

US 6,832,345 B2

METHOD FOR COEXISTENCE AND COOPERATION BETWEEN SYSTEM FIRMWARE AND DEBUG CODE

FIELD OF THE INVENTION

The present invention relates generally to the data processing field, and more particularly, relates to a method and apparatus for implementing coexistence and cooperation between system firmware and debug code.

DESCRIPTION OF THE RELATED ART

During bring-up of a machine, such as an International Business Machines Corporation AS/400® or RS/6000®, typically multiple different tools for testing are required. For example, debug tools, such as a JTAG-base bring-up tools often are required for testing certain integrated circuit chips in the machine under test. System firmware of a host computer used for testing, typically provides a different set of tools.

Although the debug tools and the host computer system firmware may generally perform similar functions, the user interface, command syntax, and the capabilities of the debug tools and the host computer system firmware are generally different.

A need exists for a method to allow coexistence and cooperation between system firmware and debug tools for testing.

As used in the following description and claims, the term coexistence means a user can use either the system firmware or the debug tool at any time.

As used in the following description and claims, the term cooperation means that at a certain point in an operational sequence of a machine under test the system firmware might be used for certain operations and the debug tool for other functions that are not implemented in the system firmware. For example, during an initial power-on routine, system firmware might be used for certain operations and the debug code for other functions that are not implemented in the system firmware.

SUMMARY OF THE INVENTION

A principal object of the present invention is to provide a method and apparatus for implementing coexistence and cooperation between system firmware and debug code. Other important objects of the present invention are to provide such method and apparatus for implementing coexistence and cooperation between system firmware and debug code substantially without negative effect and that overcome many of the disadvantages of prior art arrangements.

In brief, a method and apparatus are provided for implementing coexistence and cooperation between system firmware and debug code. A service processor is coupled to a machine under test for sending system firmware test functions to the machine under test and receiving test data from the machine under test. A host computer is coupled to the service processor for sending bring-up tool debug test functions to the machine under test and receiving test data from the machine under test. The system firmware starts without user intervention on initial power-on routine of the machine under test. When the host computer receives a user request, the host computer notifies the service processor. The bring-up tool debug test functions are started responsive to the user request.

In accordance with features of invention, the system firmware can be used for certain operations to a certain point in an operational test sequence of the machine under test and then the debug tool debug test functions are used for other functions that are not implemented in the system firmware. A user can use either the system firmware or the bring-up tool debug test functions at any time.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
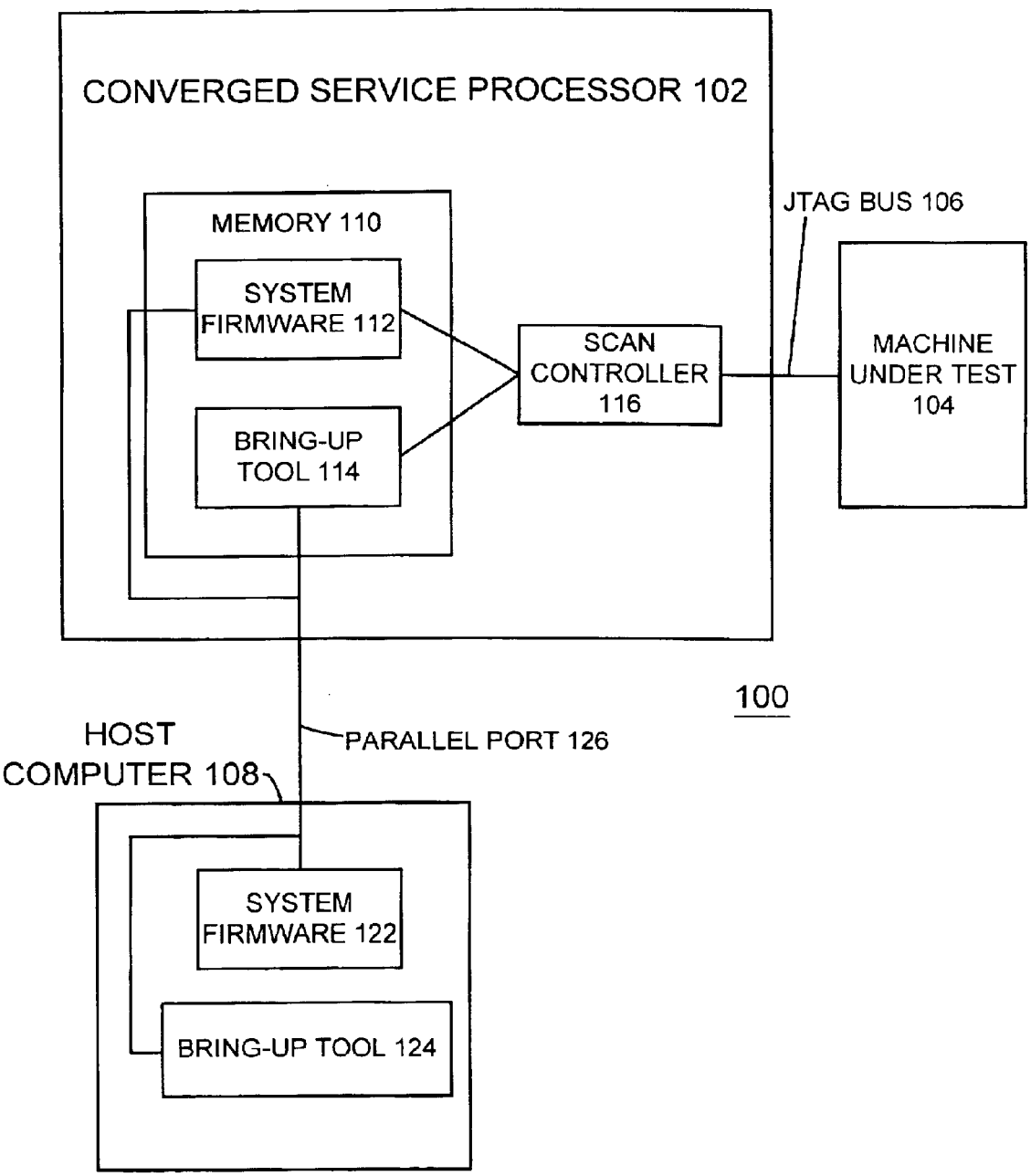
FIG. 1 is a block diagram representation illustrating a computer system for implementing coexistence and cooperation between system firmware and debug code in accordance with the preferred embodiment.

Having reference now to the drawings, in FIG. 1, there is shown a test system of the preferred embodiment generally designated by the reference character 100. As shown in FIG. 1, test system 100 includes a service processor 102 coupled to a machine under test 104 via a JTAG bus 106. JTAG bus 106 provides a standardized interface for bi-directional data transfer to and from the machine under test 104. A host computer 108 is coupled to the service processor 102 for bi-directional communications.

Service processor 102 includes a memory 110 for storing software including a system firmware 112 and a bring-up tool 114. Service processor 102 includes a scan controller 116 coupled to the machine under test 104 via JTAG bus 106. Scan controller 116 sends data to the machine under test 104 via JTAG bus 106. The machine under test 104 returns data back to the scan controller 116 via JTAG bus 106.

Various complex machines 104 can be tested in the test system 100. For example, the machine under test 104 can be, such as, an International Business Machines Corporation AS/400® or RS/6000®, where multiple different tools for testing are required.

System firmware 112 of service processor 102 provides a large set of tools to perform predefined tests on the machine under test 104 using scan controller 116. The system firmware 112 of service processor 102 includes a large code for extensive testing of the machine under test 104 using the scan controller 116. Bring-up tool 114 of service processor 102 includes a relatively small code to control the scan controller 116. Bring-up tool 114 of service processor 102 provides a server function for the host computer 108.

Host computer 108 includes a system firmware 122 and a bring-up tool 124. Host computer 108 is coupled to the service processor 102, for example, via a parallel port 126. Host computer 108 may be implemented using any suitable computer, such as an IBM personal computer running the OS/2® operating system. The bring-up tool 124 of host computer 108 provides a different, large set of tools than the system firmware 112 of service processor 102 for performing predefined debug tests on the machine under test 104 using scan controller 116.

In accordance with features of the preferred embodiment, service processor 102 is a converged service processor for implementing coexistence and cooperation between system firmware and debug code. Both system firmware 112 and the bring-up tool 124 run on the converged service processor 102. The user is enabled to easily use either tool set of system firmware 112 or the bring-up tool 124 at any time.

In accordance with features of the preferred embodiment, commands executed on the host machine 108 attached to the service processor 102 via parallel port 126 may communicate with code loads of either the system firmware 112 or the bring-up tool 114. System firmware 112 or the bring-up tool 114 running on the converged service processor 102 may include semaphores to determine which code is being asked to carry out the user's instructions. Program semaphores in the system firmware 112 and the debug tool 114 control access to the scan controller 116 of the converged service processor 102.

Each bring-up tool 114 and 124 is a JTAG-based bring-up tool for implementing debug functions that run on the service processor 102. Bring-up tool 124 of host computer 108 is user driven or runs responsive to a user request. Bring-up tool 114 of service processor 102 provides a server function for performing predefined debug tests of bring-up tool 124 on the machine under test 104 using scan controller 116.

Bring-up tool 114 sends debug tests from bring-up tool 124 to the machine under test 104 via the scan controller 116. Bring-up tool 114 returns debug test data from the machine under test 104 to the bring-up tool 124 of host computer.

System firmware 112 of service processor 102 runs on the service processor 102 independently without user intervention. In general there is no interaction between the system firmware 112 and the bring-up tools 114 and 124. System firmware 112 of service processor 102 communicates with the system firmware 122 of host computer 108 to provide information to a user. For example, system firmware 112 communicates with the system firmware 122 to provide a failure notice of an identified failure in the machine under test 104. System firmware 122 of host computer 108 provides a graphical user interface (GUI) for receiving user requests or commands. Bring-up tool 124 of host computer 108 also includes a small user interface code.

In accordance with features of the preferred embodiment, cooperation between system firmware and debug code is provided. For example, during an initial power-on routine of the machine under test 104, system firmware 112 might be used for certain operations to a certain point and then the debug code of the bring-up tools 124 is used for other functions that are not implemented in the system firmware 112. Then the initial power-on routine of the machine under test 104 continues using the system firmware 112 after the debug functions of the bring-up tool 124 are completed.

In typical operation of test system 100, system firmware 112 starts without user intervention on initial power-on routine of the machine under test 104. When the user selects debug functions of the bring-up tool 124, system firmware 112 is notified and stops its testing. Then the bring-up tool 124 controls the scan controller 116 via bring-up tool 114 to perform the user selected debug functions of the bring-up tool 124. When the system firmware 112 identifies a failure during testing of the machine under test 104, system firmware 112 stops its testing and sends a failure notice to the host computer 108. For example, system firmware 112 sends the failure notice to the system firmware 122 of the host computer 108. The user can select debug functions of the bring-up tool 124 responsive to the failure notice from system firmware 112. Then the user selected debug functions of the bring-up tool 124 or system firmware 112 are used to efficiently identify the cause of the failure in the machine under test 104.

Figure 2:
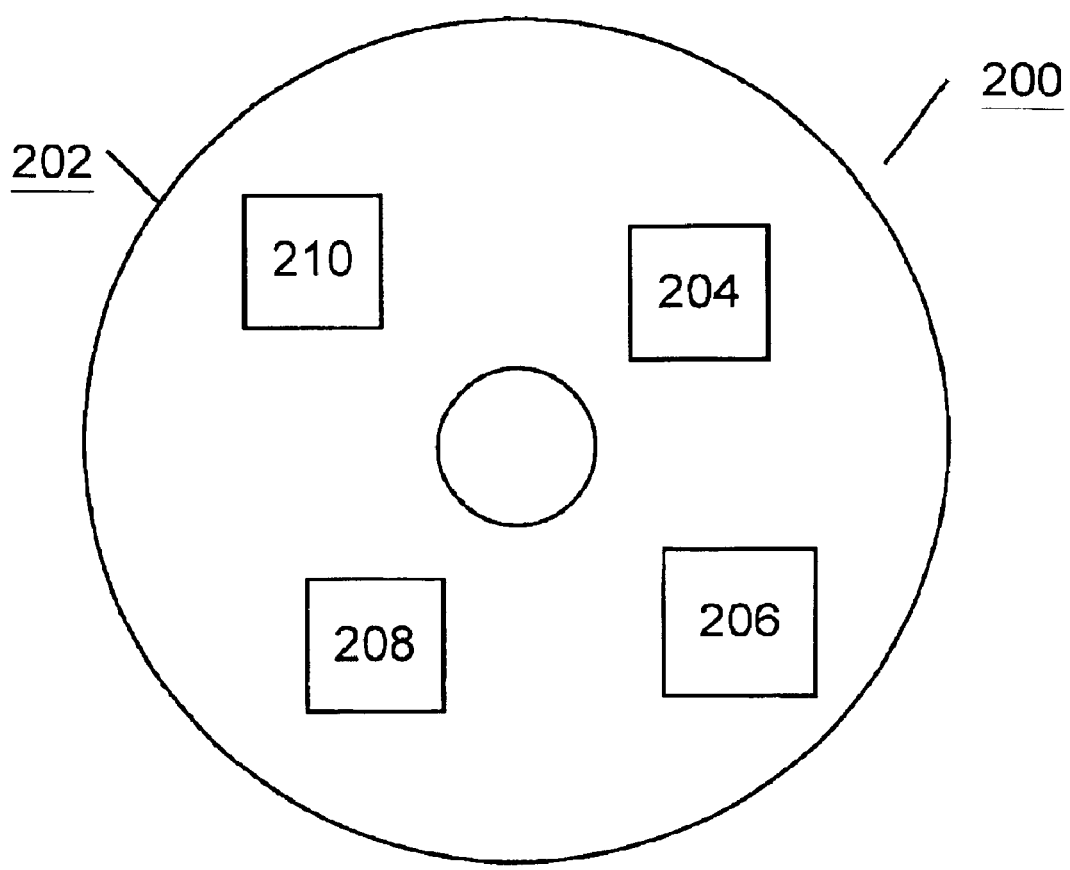
FIG. 2 is a block diagram illustrating a computer program product in accordance with the preferred embodiment.

Referring now to FIG. 2, an article of manufacture or a computer program product 200 of the invention is illustrated. The computer program product 200 includes a recording medium 202, such as, a floppy disk, a high capacity read only memory in the form of an optically read compact disk or CD-ROM, a tape, a transmission type media such as a digital or analog communications link, or a similar computer program product. Recording medium 202 stores program means 204, 206, 208, 210 on the medium 202 for carrying out the methods for implementing coexistence and cooperation between system firmware and bring-up tool debug code of the preferred embodiment in the system 100 of FIG. 1.

A sequence of program instructions or a logical assembly of one or more interrelated modules defined by the recorded program means 204, 206, 208, 210, direct the system 100 for implementing coexistence and cooperation between system firmware and bring-up tool debug code of the preferred embodiment.

While the present invention has been described with reference to the details of the embodiments of the invention shown in the drawing, these details are not intended to limit the scope of the invention as claimed in the appended claims.

What is claimed is:

1. A method for implementing coexistence and cooperation between system firmware and debug code in a test system comprising the steps of:

providing a service processor for storing a system firmware for implementing system firmware test functions;

providing said service processor coupled to a machine under test for sending said system firmware test functions to said machine under test and receiving test data from said machine under test;

providing a host computer for storing a bring-up tool for implementing bring-up tool debug test functions;

providing said host computer coupled to said service processor for sending said bring-up tool debug test functions to said machine under test and receiving test data from said machine under test;

starting said system firmware test functions without user intervention on initial power-on routine of the machine under test;

receiving a user request with said host computer and notifying said service processor;

starting said bring-up tool debug test functions responsive to said user request; and identifying a failure in said machine under test with said system firmware test functions, stopping said system firmware test functions, and notifying said host computer.

2. A method for implementing coexistence and cooperation between system firmware and debug code in a test system as recited in claim 1 wherein the step of providing said service processor coupled to a machine under test for sending system firmware test functions to said machine under test and receiving test data from said machine under test includes the step of storing system firmware in said service processor for sending said system firmware test functions to said machine under test and receiving said test data from said machine under test by said service processor.

3. A method for implementing coexistence and cooperation between system firmware and debug code in a test system as recited in claim 1 wherein the step of providing said host computer coupled to said service processor for sending bring-up tool debug test functions to said machine under test and receiving test data from said machine under test includes the step of storing a bring-up tool in said host computer for sending bring-up tool debug test functions to said machine under test and receiving test data from said machine under test.

4. A method for implementing coexistence and cooperation between system firmware and debug code in a test system as recited in claim 1 includes the step of receiving a user request and starting said bring-up tool debug test functions responsive to said user request.

5. A method for implementing coexistence and cooperation between system firmware and debug code in a test system as recited in claim 4 includes the step of completing said bring-up tool debug test functions and starting said system firmware test functions without user intervention.

6. A method for implementing coexistence and cooperation between system firmware and debug code in a test system as recited in claim 1 wherein the steps of providing said service processor coupled to said machine under test for sending system firmware test functions to said machine under test and receiving test data from said machine under test; and providing said host computer coupled to said service processor for sending bring-up tool debug test functions to said machine under test and receiving test data from said machine under test includes the step of providing said service processor with a scan controller coupled to said machine under test and said system firmware test functions and said bring-up tool debug test functions controlling access to the scan controller.

7. A method for implementing coexistence and cooperation between system firmware and debug code in a test system as recited in claim 6 includes the step of storing system firmware in said service processor for controlling said scan controller for sending said system firmware test functions to said machine under test and receiving said test data from said machine under test by said service processor.

8. A method for implementing coexistence and cooperation between system firmware and debug code in a test system as recited in claim 7 includes the step of storing a bring-up tool in said host computer for controlling said scan controller for sending bring-up tool debug test functions to said machine under test and receiving test data from said machine under test.

9. A method for implementing coexistence and cooperation between system firmware and debug code in a test system as recited in claim 8 includes the step of completing said bring-up tool debug test functions.

10. A method for implementing coexistence and cooperation between system firmware and debug code in a test system as recited in claim 9 includes the step responsive to completing said bring-up tool debug test functions of starting said system firmware test functions without user intervention.

11. Apparatus for implementing coexistence and cooperation between system firmware and debug code in a test system comprising:
a service processor for storing a system firmware for implementing system firmware test functions;
said service processor coupled to a machine under test for sending said system firmware test functions to said machine under test and receiving test data from said machine under test;
a host computer for storing a bring-up tool for implementing bring-up tool debug test functions;
said host computer coupled to said service processor for sending said bring-up tool debug test functions to said machine under test and receiving test data from said machine under test;
said service processor including a scan controller for transferring said system firmware test functions and said bring-up tool debug test functions to said machine under test and receiving said test data from said machine under test;
said system firmware test functions and said bring-up tool debug test functions controlling access to said scan controller; and
said service processor responsive to identifying a failure in said machine under test with said system firmware test functions, for stopping said system firmware test functions, and for notifying said host computer.

12. Apparatus for implementing coexistence and cooperation between system firmware and debug code in a test system as recited in claim 11 wherein said scan controller is coupled to said machine under test by a JTAG bus.

13. Apparatus for implementing coexistence and cooperation between system firmware and debug code in a test system as recited in claim 11 wherein said host computer coupled to said service processor includes system firmware for providing a graphical user interface.

14. Apparatus for implementing coexistence and cooperation between system firmware and debug code in a test system as recited in claim 11 wherein said host computer is responsive to a user request for sending bring-up tool debug test functions to said machine under test and receiving test data from said machine under test.

15. Apparatus for implementing coexistence and cooperation between system firmware and debug code in a test system as recited in claim 11 wherein said service processor is responsive to an initial power-on routine of the machine under test for sending system firmware test functions to said machine under test and receiving test data from said machine under test without user intervention.

16. Apparatus for implementing coexistence and cooperation between system firmware and debug code in a test system as recited in claim 11 wherein said service processor is responsive to said bring-up tool debug test functions completing for sending system firmware test functions to said machine under test and receiving test data from said machine under test without user intervention.

17. A computer program product for implementing coexistence and cooperation between system firmware and debug code in a test system including a service processor coupled to a machine under test and coupled to a host computer, said computer program product including a plurality of computer executable instructions stored on a computer readable medium, wherein said instructions, when executed by said service processor, cause the service processor to perform the steps of:
starting system firmware test functions without user intervention on initial power-on routine of the machine under test;
sending said system firmware test functions to said machine under test and receiving test data from said machine under test;
receiving a user request with said host computer and notifying said service processor;
starting bring-up tool debug test functions responsive to said user request;
sending said tool debug test functions to said machine under test and receiving test data from said machine under test; and
identifying a failure in said machine under test with said system firmware test functions, stopping said system firmware test functions, and notifying said host computer.

* * * * *